United States Patent
Huang et al.

[11] Patent Number: 5,700,726
[45] Date of Patent: Dec. 23, 1997

[54] MULTI-LAYERED TUNGSTEN DEPOSITIONS FOR CONTACT HOLE FILLING

[75] Inventors: Yung-Sheng Huang, Hsin-chu; Nun-Sian Tsai, Hsinchu, both of Taiwan

[73] Assignee: Taiwan Semiconductor Manufacturing Company Ltd, Hsin-chu, Taiwan

[21] Appl. No.: 668,992

[22] Filed: Jun. 21, 1996

[51] Int. Cl.$^6$ .................. H01L 21/283; H01L 21/3065
[52] U.S. Cl. .................. 437/643; 437/648; 437/672; 437/738
[58] Field of Search .................. 437/189, 190, 437/192; 438/643, 645, 648, 738, 627, 628, 629, 637, 672

[56] References Cited

U.S. PATENT DOCUMENTS

| | | |
|---|---|---|
| 5,035,768 | 7/1991 | Mu et al. .................. 156/626 |
| 5,332,691 | 7/1994 | Kinoshita et al. .................. 437/192 |
| 5,407,698 | 4/1995 | Emesh .................. 427/99 |
| 5,407,861 | 4/1995 | Marangon et al. .................. 437/192 |
| 5,422,310 | 6/1995 | Ito .................. 437/192 |
| 5,436,200 | 7/1995 | Tanaka .................. 437/192 |
| 5,489,552 | 2/1996 | Merchant et al. .................. 437/192 |

OTHER PUBLICATIONS

Riley, P., et al., "Implementation of Tungsten Metallization ...," IEEE Trans. Semi.Manu., vol. 3, No. 4, Nov. 1990, pp. 150–157.
Wolf, S., Silicon Processing for the VLSI Era, vol. 2, 1990, Lattice Press, pp. 101–109, 244–252, 264.

*Primary Examiner*—T. N. Quach
*Attorney, Agent, or Firm*—George O. Saile; Stephen B. Ackerman

[57] ABSTRACT

A process for filling small diameter contact holes, with tungsten, has been developed. This process consists of using two consecutive tungsten depositions. A first tungsten layer, that will exhibit a fast removal rate in a specific dry etch chemistry, such as RIE, is used to coat the sidewalls of the small diameter contact hole. Next a second layer of tungsten, that will exhibit a significantly slower removal rate then the first tungsten layer, is used to completely fill the contact hole. Etchback, to remove unwanted material from areas outside the contact hole, does not significantly attack the second tungsten fill, in the contact hole, thus not aggravating any seams in the second tungsten fill that may have been created during the LPCVD tungsten, contact hole fill process.

12 Claims, 5 Drawing Sheets

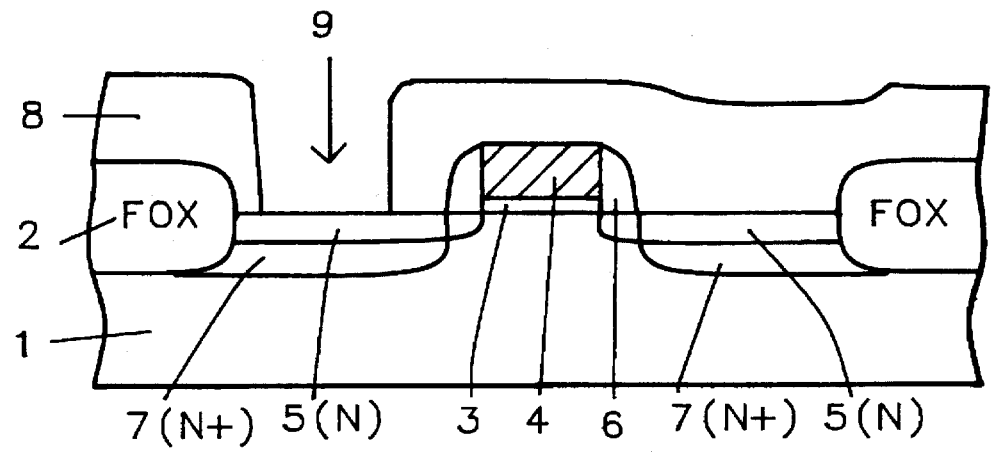
*FIG. 1*
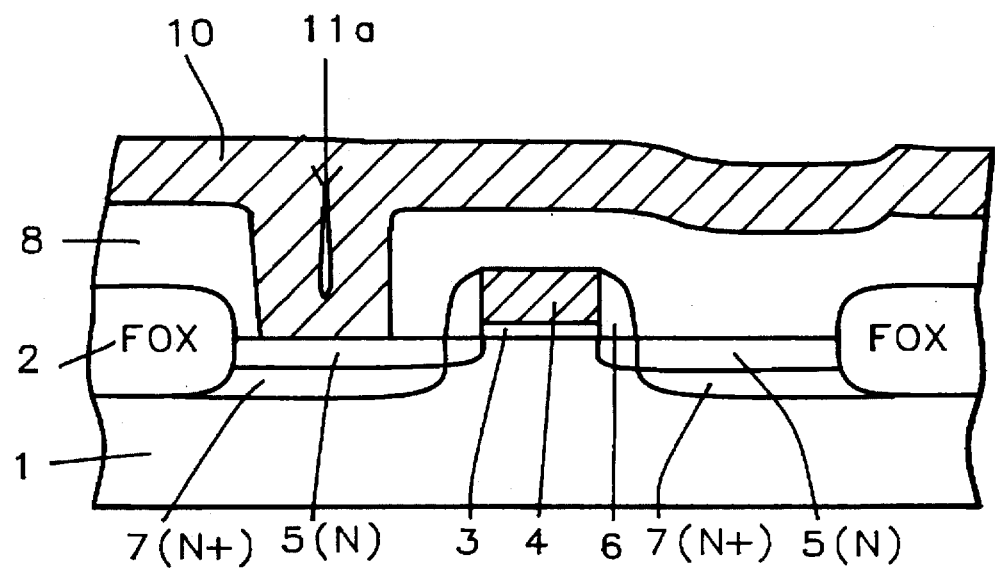
*FIG. 2 - Prior Art*

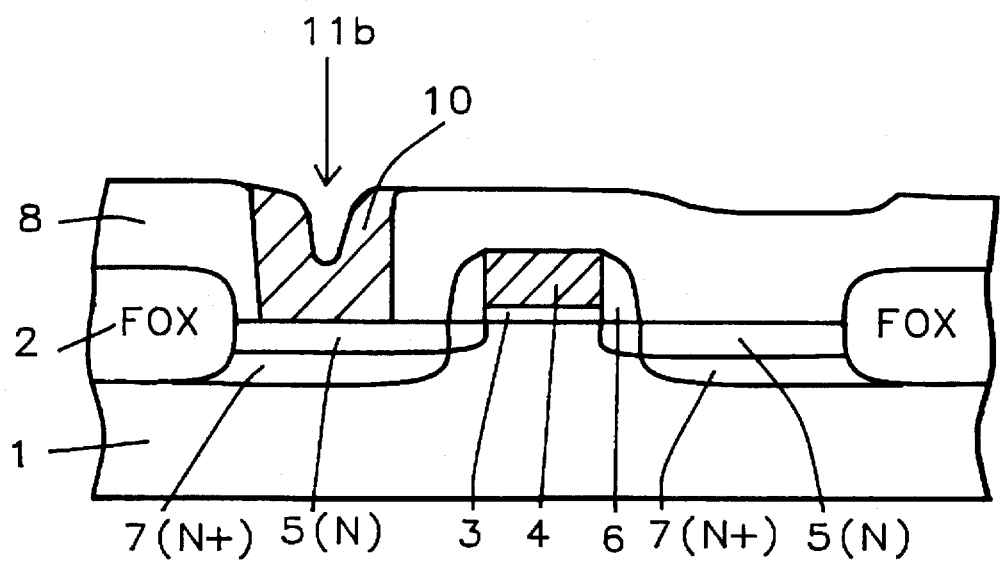
FIG. 3 - Prior Art
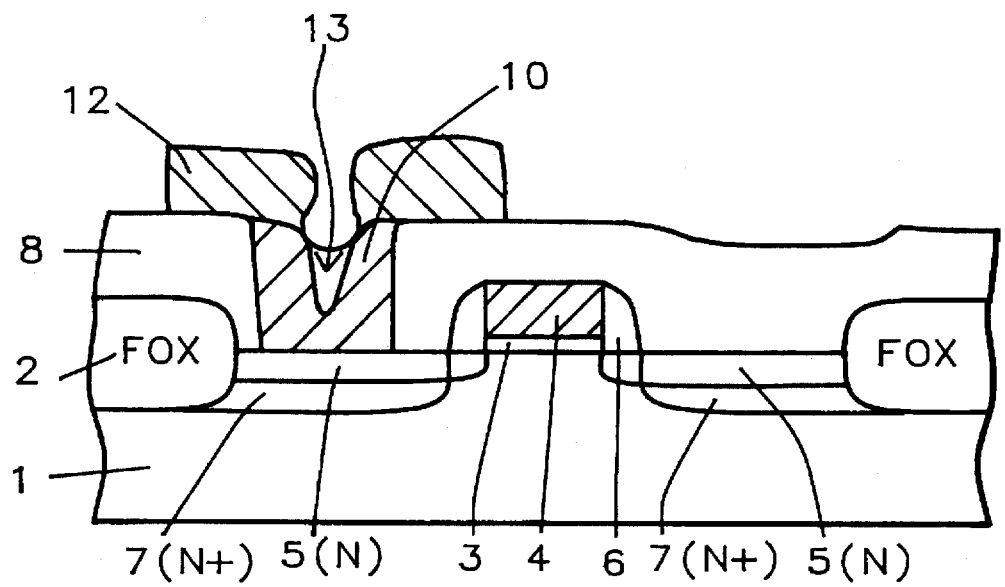
FIG. 4 - Prior Art

MULTI-LAYERED TUNGSTEN DEPOSITIONS FOR CONTACT HOLE FILLING

BACKGROUND OF THE INVENTION

(1) FIELD OF THE INVENTION

This invention relates to methods used to fabricate semiconductor devices, and more specifically to a process used to fill contact holes with tungsten.

(2) DESCRIPTION OF PRIOR ART

The semiconductor industry is continually striving to increase the performance of silicon devices, while still maintaining, or lowering the cost of manufacturing these higher performing devices. The trend to microminiaturazation, or the ability to produce silicon devices with sub-micron features, has allowed the performance and cost objectives to be realized. The use of sub-micron features has resulted in the attainment of smaller chips, allowing more silicon chips to be obtained from a specific size starting silicon wafer, thus reducing the cost of a specific silicon chip. In addition the reduction in critical device dimensions, has resulted in higher performing devices via reductions in performance degrading resistances and capacitances. However the use of sub-micron features can also increase the risk of yield and reliability failures.

As contact or via holes decrease in size, regarding the diameter of contact hole opening, the aspect ratio, or the ratio of the depth of the contact hole, to the diameter opening, becomes large. These high aspect ratio contact holes are now more difficult to fill with conventional metallization processes, then counterparts with smaller aspect ratios. The use of aluminum based metallizations, for filling high aspect ratio contact holes, encounters many problems. First conventional aluminum deposition techniques, such as sputtering or evaporation, have difficulty in conformally filling these deep, narrow, contact holes, which can result in yield problems. In addition the inability of aluminum based metallizations, to sustain the higher current densities, needed with the smaller contact holes, can ultimately result in electromigration, reliability failures. Therefore the semiconductor industry has evolved to the use of tungsten for filling narrow, deep contact, or via holes.

The switch to tungsten filled contact holes was made to take advantage of the improved conformality, or step coverage, resulting from the use of a low pressure chemical vapor deposition, (LPCVD), process. In addition the high current carrying characteristics of tungsten, remove the risk of electromigration failures. However the characteristics of LPCVD depositions is to basically fill holes by depositing on the sides of the hole. Sometimes at the completion of the tungsten fill, a buried seam, or void, is present at a point where the depositing tungsten, on the sides of the contact hole, converge. This buried seam, or void, can be exposed during subsequent processing, such as dry etching procedures used to remove unwanted tungsten from regions other then the contact hole. The size of the seam or void in the tungsten fill can be increased due to exposure to the dry etching procedure, creating a difficult topology for subsequent metallization coverage. Therefore many processes have been developed, either attempting to create seamless tungsten contact hole fills, or repairing of the seam or void in the tungsten fill.

Marangon, et al, in U.S. Pat. No. 5,407,861, have described a process for removing unwanted tungsten, from areas outside the contact hole, via use of a two stage, dry etching procedure. This process features a reduction in the removal rate of tungsten at the completion of residual removal, thus not significantly attacking the exposed tungsten in the contact hole. This invention will describe a two stage tungsten fill process, in which the underlying tungsten layer exhibits a significantly higher etch rate then an overlying second tungsten layer, when using a specific dry etch process. Since the second tungsten layer is filling the small diameter contact hole, and therefore exposed during the etchback process, the slow etch rate characteristic of the second tungsten layer, will allow it to withstand the dry etching procedures without aggravating the tungsten seam or void, created in the second tungsten layer during the tungsten deposition phase.

SUMMARY OF THE INVENTION

It is an object of this invention to provide a process for fabricating tungsten filled contact holes, to be used to connect active silicon device regions, in a semiconductor substrate, to an overlying metallization.

It is another object of this invention to deposit an underlying layer of tungsten, on the sides and at the bottom of a small diameter contact hole, without completely filling the hole, which will exhibit a high removal rate in a specific dry etch chemistry.

It is another object of this invention to deposit an overlying layer of tungsten, completely filling the small diameter contact hole, which will exhibit a slow removal rate in a specific dry etch chemistry.

It is yet another object of this invention to use a specific dry etch chemistry to remove tungsten from unwanted regions, while not significantly attacking the tungsten fill in the small diameter contact hole.

In accordance with the present invention a process is described for fabricating tungsten filled contact holes, using a multi-layer tungsten deposition process. A contact hole is opened in a dielectric layer, to an active device region in a semiconductor substrate. A layer of titanium, to be used for adhesion and contact purposes, and a layer of titanium nitride, to be used as a barrier to protect underlying materials from subsequent process reactants, are deposited. An underlying layer of tungsten, deposited at conditions that will result in a fast removal rate in a specific dry etch chemistry, is deposited at a thickness that will not fill the contact hole. A second layer of tungsten, deposited using conditions that will result in a slow removal rate in a specific dry etch chemistry, is deposited to a thickness that results in complete filling of the contact hole. Subsequent dry etching procedures remove the unwanted tungsten layers, from regions other then the contact hole, while not significantly attacking the slower etching tungsten fill layer. Interconnect metallization and patterning complete the process.

BRIEF DESCRIPTION OF THE DRAWINGS

The object and other advantages of this invention are best described in the preferred embodiment with reference to the attached drawings that include:

FIG. 1, which schematically, in cross-sectional style, shows a silicon device, at a stage prior to tungsten contact hole filling.

FIGS. 2–4, which schematically, in cross-sectional style, show prior art, in which fabrication sequences, used to create tungsten filled contact holes, aggravated the seams in the tungsten fill.

DESCRIPTION OF THE PREFERRED EMBODIMENTS

Figure 5:
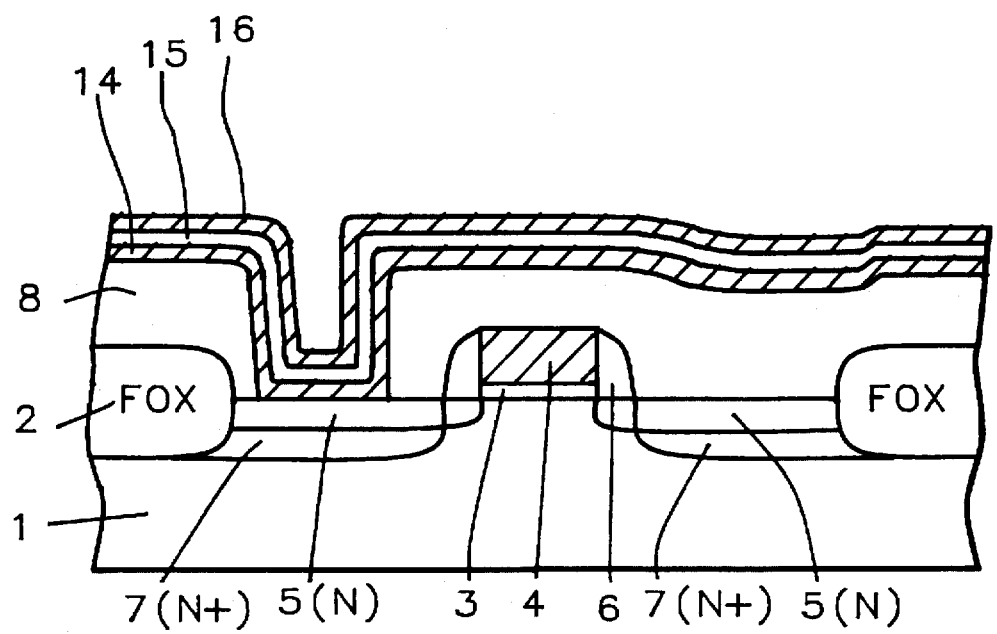
FIGS. 5–9, which schematically, in cross-sectional style, show the stages of fabrication, used to create tungsten filled contact holes, without deleterious enlargement of the tungsten seam during subsequent processing steps.

The method of fabricating a tungsten filled contact hole, without creating a damaging seam during post-tungsten deposition, will now be described. This invention can be used as part of metal oxide semiconductor field effect transistor, (MOSFET), devices, that are currently being manufactured in industry, therefore only the specific areas unique to understanding this invention will be covered in detail.

FIG. 1, schematically shows a typical N channel, (NFET), device, that contact holes filled with tungsten, will be applied to. A substrate, 1, composed of a P type, single crystalline silicon, with a <100> crystallographic orientation, is used. Thick field oxide, (FOX), regions, 2, used for isolation purposes, are formed using an oxidation masking pattern composed of an overlying silicon nitride layer, and an underlying silicon dioxide layer. The composite insulator mask is patterned using conventional photolithographic and reactive ion etching, (RIE), processes. After photoresist removal, via plasma oxygen ashing and careful wet cleans, a silicon dioxide, FOX region, 2, is formed via a oxygen—steam, thermal oxidation, at a temperature between about 850° to 1050° C., to a thickness between about 4000 to 6000 Angstroms. After removal of the composite insulator oxidation mask, using hot phosphoric acid for the silicon nitride layer, and a buffered hydrofluoric acid solution for the underlying silicon dioxide layer, a thin silicon dioxide, gate insulator, 3, is grown in an oxygen—steam ambient, at a temperature between about 800° to 1000° C., to a thickness between about 50 to 300 Angstroms. A polysilicon layer is intrinsically deposited using LPCVD processing, at a temperature between about 500° to 700° C., to a thickness between about 1500 to 4000 Angstroms. Ion implantation of arsenic or phosphorous is next performed at an energy between about 50 to 100 Kev., at a dose between about 1E15 to 1E16 atoms/cm$^2$, for purposes of doping the intrinsic polysilicon layer. Another alternative is to eliminate the ion implantation step by depositing the polysilicon layer using insitu doping procedures, by adding either phosphine or arsine to the silane ambient during the LPCVD procedure. Standard photolithographic and RIE procedures, using Cl$_2$ as an etchant, are used to create polysilicon gate structure 4, shown in FIG. 1.

After removal of the photoresist pattern, used to define polysilicon gate structure, 4, via plasma oxygen ashing and careful wet cleans, an ion implantation of phosphorous is performed at an energy between about 30 to 60 Kev., at a dose between about 1E12 to 5E13 atoms/cm$^2$, creating lightly doped source and drain region, 5. A silicon oxide layer is next deposited, using either LPCVD or plasma enhanced chemical vapor deposition, (PECVD), processing, at a temperature between about 500° to 800° C., to a thickness between about 1500 to 4000 Angstroms, using tetraethylorthosilicate as a source. An anisotropic, RIE procedure, using CHF$_3$ as an etchant, follows, resulting in insulator sidewall spacer, 6, being created on the exposed sides of polysilicon gate structure, 4. Another ion implantation procedure, using arsenic at an energy between about 50 to 100 Kev., at a dose between about 1E14 to 5E15 atoms/cm$^2$, is performed to create heavily doped source and drain region, 7, shown schematically in FIG. 1.

A layer of silicon oxide, 8, is deposited, again using either LPCVD or PECVD processing, at a temperature between about 500° to 800° C., to a thickness between about 3000 to 8000 Angstroms. Photolithographic and RIE procedures, using CHF$_3$ as an etchant, are performed to open contact hole, 9. To satisfy the increased performance objectives, aggressive designs, necessitating contact holes with submicron features, are used. Contact hole 9, is fabricated with a diameter opening between about 0.3 to 0.7 uM. This small opening, along with the depth of the contact hole, results in a high aspect ratio contact hole, which can create difficulties when attempting to fill with conventional metallization processes. FIG. 1, schematically shows this structure after photoresist removal, again via use of plasma oxygen ashing, followed by careful wet cleans.

Attempts at fabricating tungsten filled, small diameter, contact holes, and the effects of subsequent process sequences, are schematically shown in FIGS. 2–4. FIG. 2, shows the result of an tungsten LPQVD deposition, using tungsten hexafluoride as a source, attempting to fill high aspect ratio, contact hole, 9. The deposition of tungsten layer, 10, is performed at a temperature between about 440° to 500° C., to a thickness between about 5000 to 10000 Angstroms. The filling of contact hole, 9, takes places by tungsten deposition on the sides of the contact hole. At the conclusion of the deposition procedure it is likely that a seam, 11a, in the tungsten fill, exists, due to the pinching or closing effect occurring when the sidewall tungsten layers converge. Subsequent removal of unwanted tungsten, using dry etching processing, such as RIE, from areas other then the contact hole, can expose seam 11a, and create a larger defect, such as opening, 11b, shown schematically in FIG. 3. The consequence of opening 11b, is realized when overlying interconnect metallizations, such as an r.f. sputtered aluminum based structure, 12, can not adequately fill opening 11b, resulting in a thin aluminum layer, and a void between aluminum, 12, and tungsten, 10, in region 13, shown schematically in FIG. 4 The thin aluminum layer is now vulnerable to electromigration failures due to the increased current densities that will be present due to the poor aluminum coverage in region 13. In addition the void between aluminum, 12, and tungsten, 10, can trap contaminants such as fluorine or chlorine residuals, possibly resulting in aluminum corrosion.

A process will now be described in which a seam in a tungsten fill will not be subjected to subsequent process steps, thus avoiding the deleterious effects previously described in FIGS. 2–4. Again, applying this invention to the MOSFET device shown in FIG. 1, a buffered hydrofluoric acid pre-clean is performed, followed by the deposition of a titanium layer, 14, obtained via r.f. sputtering, to a thickness between 200 to 500 Angstroms. The titanium layer, 14, shown in FIG. 5, is used to provide a low resistance contact to underlying, heavily doped source and drain regions, 7, and also provides excellent adhesion to the silicon oxide sidewalls, of contact hole, 9. Next a layer of titanium nitride, 15, is deposited, again using r.f. sputtering, to a thickness between about 500 to 1000 Angstroms. This barrier layer offers protection to underlying materials, during the subsequent tungsten depositions. The decomposition of tungsten hexafluoride occurs with the evolution of by-products which would attack the underlying titanium layer, 14, if the barrier layer of titanium nitride were not present. Next a thin layer of tungsten is deposited, using LPCVD processing, at a temperature between about 450° to 500° C., to a thickness between about 1000 to 2500 Angstroms. The thickness of the tungsten layer is dependent on the diameter of contact hole, 9. That is the smaller the diameter of contact hole, 9, the thinner the layer of tungsten. This tungsten layer, 16, shown schematically in FIG. 5, is grown using between about 80 to 120 sccm of $WF_6$, between about 500 to 1200 sccm of $H_2$, and between about 10 to 30 sccm of $SiH_4$. The thickness of tungsten layer, 16, is designed to coat the sidewalls of contact hole, 9, without completely filling the hole.

Figure 6:
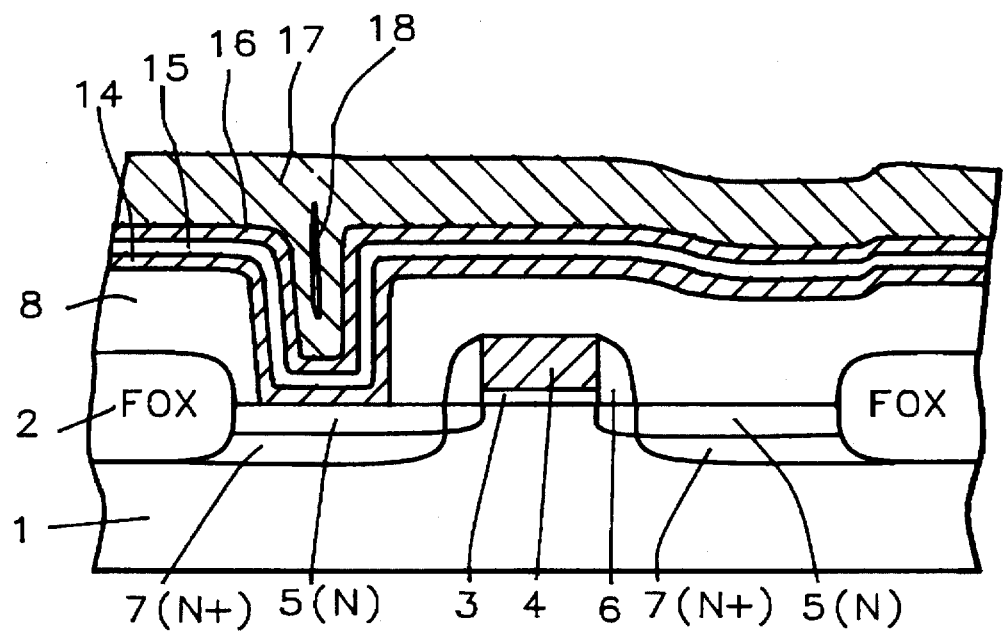

FIG. 6, shows the result of an overlying, second tungsten layer, 17, obtained again via the use of LPCVD processing, at a temperature between about 350° to 450° C., to a thickness between about 2500 to 7000 Angstroms. Tungsten layer, 17, is grown using between about 80 to 120 sccm of $WF_6$, between about 400 to 1000 sccm of $H_2$, and between about 20 to 60 sccm of $SiH_4$, thus resulting in a different film density then counterpart tungsten layer, 16. The difference in film density will ultimately result in different removal rates, allowing this invention to occur. The thickness of tungsten layer, 17, is selected to insure complete filling of contact hole, 9. A buried seam, 18, is present in tungsten layer, 17, due to the convergence of the tungsten coated sidewalls.

Figure 7:
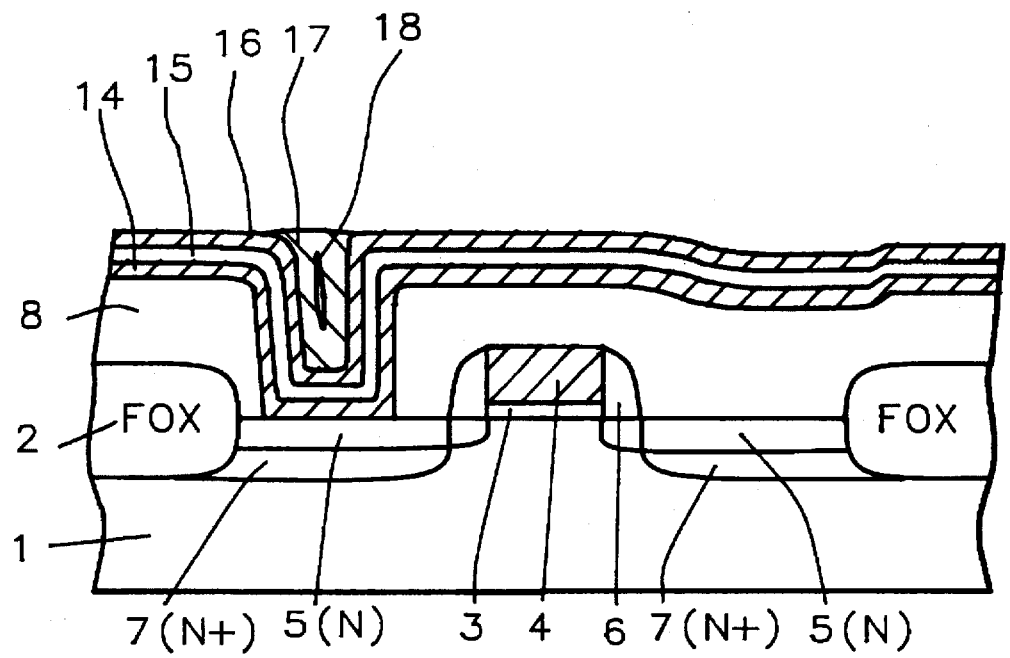
Figure 8:
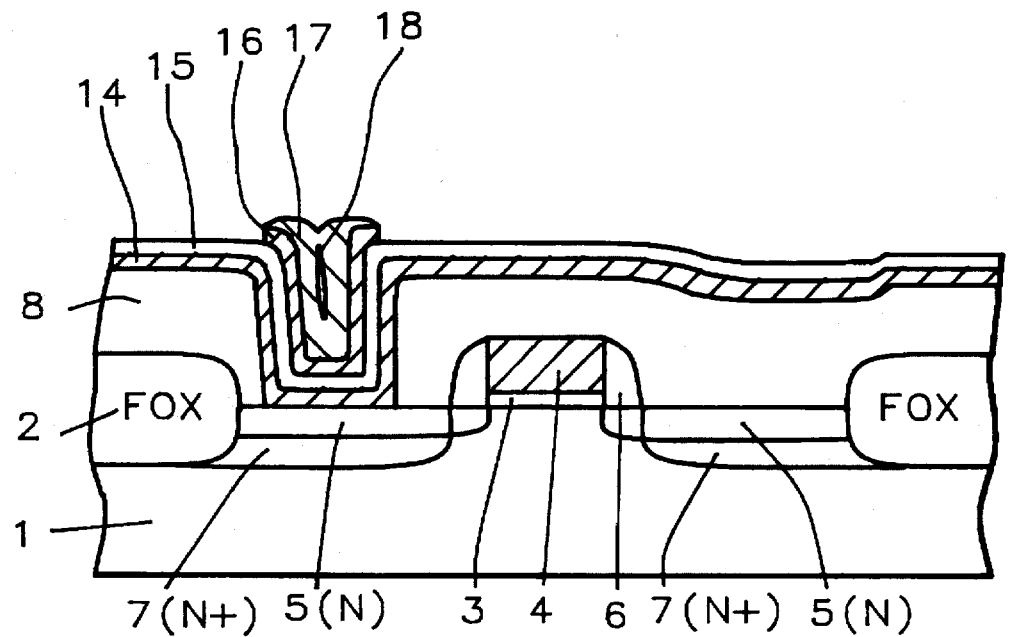

The etch back used to create the tungsten plug is shown in two stages. First a dry etch procedure, such as RIE, using $SF_6$—Ar—$O_2$ as an etchant is used to etch back tungsten layer, 17, to a point where underlying tungsten layer, 16, is exposed on non-contact hole surfaces. This is shown in FIG. 7. The etch rate of tungsten layer, 17, using $SF_6$—Ar—$O_2$ as an etchant is between about 4000 to 5000 Angstroms/min, compared to the faster etching tungsten layer, 16, which exhibits a higher etch rate of between about 5500 to 6500 Angstroms/min. The difference in RIE removal rates now allows the removal of tungsten layer, 16, during the second phase of the etch back procedure. The removal of titanium nitride layer, 15, and titanium layer, 14, can be performed either after the patterning of tungsten layer, 16, or delayed to the point in which the process in which an aluminum interconnect is being patterned. The patterning of titanium nitride layer, 15, and titanium layer, 14, is accomplished using $BCl_3$—$Cl_2$ as an etchant, with a RIE removal rate between about 1500 to 4000 Angstroms/min. The removal of the faster etching, unwanted materials, along with the slower removal rate of tungsten layer, 17, results in the tungsten plug formation in contact hole, 9. But of most importance is the slow removal rate of tungsten layer, 17, did not allow seam, 18, to be exposed to the dry etching procedure, thus not creating a deleteriously larger seam. This is schematically shown in FIG. 8.

Figure 9:
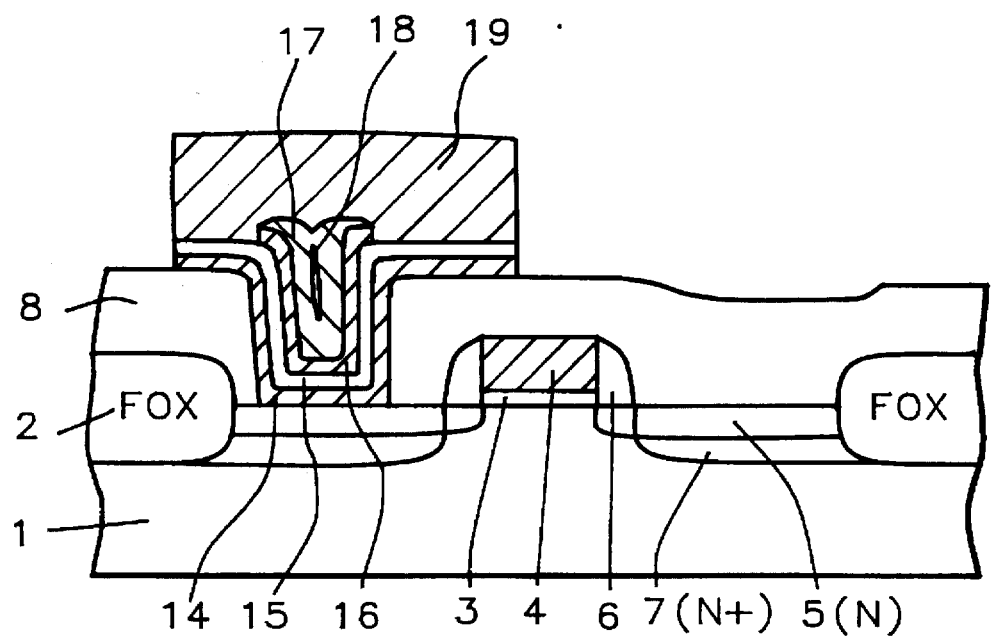

Finally a layer of aluminum, containing between about 0.5 to 3% copper, is deposited using r.f. sputtering, to a thickness between about 4000 to 6000 Angstroms. Conventional photolithographic and dry etching procedures, such as RIE, using $Cl_2$ as an etchant, are used to create interconnect metallization structure, 19, shown in FIG. 9. The interconnect metallization structure, 19, unlike counterpart structure, 12, shown previously in FIG. 4, dose not exhibit thinning or poor conformality. This does not occur due to aluminum depositing on a smooth, voidless, underlying tungsten structure, which in turn was created via a two layer tungsten deposition process. The ability to produce aluminum interconnect structures, without areas of thinning, will significantly decrease the chances of electromigration, and other reliability failures, such as aluminum corrosion, from occurring. Removal of the interconnect photoresist pattern is again accomplished via plasma oxygen ashing, followed by careful wet cleans.

This process, although shown using tungsten to fill contact holes, connecting active silicon device regions to an overlying interconnect metallization, can also be applied to tungsten filling via holes, designed to connect two levels of interconnect metallization structures. In addition this tungsten fill process, although shown as an application for an N channel, (NFET), device, can also find applications for P channel, (PFET), devices, complimentary, (CMOS), devices, as well as for BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using two layers of tungsten to fill a contact hole, with said two layers of tungsten exhibiting different removal rates for a specific etch chemistry, comprising the steps of:

providing said underlying conductive region, on said semiconductor substrate;

depositing a dielectric layer on said semiconductor substrate, including depositing said dielectric layer on said underlying conductive region;

photolithographic processing to open a region in a photoresist layer, exposing said dielectric layer, directly over a specific area of said underlying conductive region;

anisotropic etching of said dielectric layer, in opened region of said photoresist layer, to create a small diameter contact hole, to said specific area of said underlying conductive region;

removing said photoresist layer;

depositing a titanium layer on said dielectric layer, on sides of said small diameter contact hole, and on said specific area of said underlying conductive region;

depositing a titanium nitride layer on said titanium layer;

depositing a first tungsten layer on said titanium nitride layer, not completely filling said small diameter contact hole, and grown using conditions that produce a said first tungsten layer that will exhibit a fast removal rate when subjected to a specific dry etch chemistry;

depositing a second tungsten layer on said first tungsten layer, completely filling said small diameter contact hole, and grown using conditions that produce a said second tungsten layer that will exhibit a slow removal rate when subjected to a said specific dry etch chemistry;

removing said second tungsten layer from underlying first tungsten layer, in non-contact hole regions, to expose said first tungsten layer, via use of said specific dry etch chemistry;

removing said first tungsten layer, of said titanium nitride layer, and of said titanium layer, from top surface of said dielectric layer, via use of said specific dry etch chemistry, forming a composite plug of said second tungsten layer, first tungsten layer, titanium nitride layer, and titanium, in said small diameter contact hole;

depositing an interconnect metallization layer on top surface of said dielectric layer, and on surface of said composite plug, in said small diameter contact hole; and patterning of said interconnect metallization layer to form overlying interconnect metallization structure.

2. The method of claim 1, wherein said underlying conductive region, on said semiconductor substrate, is an N type, heavily doped source and drain region, of a MOSFET device.

3. The method of claim 1, wherein said underlying conductive region, on said semiconductor substrate, is a metal interconnect structure.

4. The method of claim 1, wherein said dielectric layer is silicon oxide, deposited using LPCVD or PECVD processing, at a temperature between about 500° to 800° C., to a thickness between about 3000 to 8000 Angstroms.

5. The method of claim 1, wherein said small diameter contact hole is formed via anisotropic, RIE processing, using $CHF_3$ as an etchant, with said small diameter contact hole having an opening with a diameter between about 0.3 to 0.7 micrometers, resulting in an aspect ratio between about 1 to 3.

6. The method of claim 1, wherein said titanium layer is deposited using r.f. sputtering, to a thickness between about 200 to 500 Angstroms.

7. The method of claim 1, wherein said titanium nitride layer is deposited using r.f. sputtering, to a thickness between about 500 to 1000 Angstroms.

8. The method of claim 1, wherein said first tungsten layer is deposited using LPCVD processing, at a temperature between about 450° to 500° C., to a thickness between about 1000 to 2500 Angstroms, using tungsten hexafluoride, at a flow between about 80 to 120 sccm, hydrogen, at a flow between about 500 to 1000 sccm, and silane, at a flow between about 10 to 30 sccm.

9. The method of claim 1, wherein said second tungsten layer is deposited using LPCVD processing, at a temperature between about 350° to 450° C., to a thickness between about 2500 to 7000 Angstroms, using tungsten hexafluoride, at a flow between about 80 to 120 sccm, hydrogen, at a flow between about 400 to 1000 sccm, and silane, at a flow between about 20 to 60 sccm.

10. The method of claim 1, wherein said second tungsten layer is removed via anisotropic, RIE processing, using a said specific dry etching chemistry of $SF_6$—Ar—$O_2$, and producing a removal rate for said second tungsten layer, between about 4000 to 5000 Angstroms/min.

11. The method of claim 1, wherein said first tungsten layer, is removed via anisotropic, RIE processing, using a said specific dry etching chemistry of $SF_6$—Ar—$O_2$, and producing a removal rate for said first tungsten layer, between about 5500 to 6500 Angstroms/min.

12. The method of claim 1, wherein said interconnect metallization layer is aluminum, containing between about 0.5 to 3% copper, deposited using r.f. sputtering, to a thickness between about 4000 to 6000 Angstroms.

* * * * *